United States Patent
Hantschel et al.

(10) Patent No.: US 7,943,504 B2
(45) Date of Patent: *May 17, 2011

(54) SELF-RELEASING SPRING STRUCTURES AND METHODS

(75) Inventors: Thomas Hantschel, Menlo Park, CA (US); Sven Kosgalwies, Dresden (DE); David K. Fork, Los Altos, CA (US); Eugene M. Chow, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/256,060

(22) Filed: Oct. 22, 2008

(65) Prior Publication Data
US 2009/0077807 A1 Mar. 26, 2009

Related U.S. Application Data

(62) Division of application No. 10/959,180, filed on Oct. 7, 2004, now Pat. No. 7,456,092.

(51) Int. Cl.
*H01L 21/4763* (2006.01)

(52) U.S. Cl. . 438/618; 438/666; 438/678; 257/E21.587; 257/E21.592

(58) Field of Classification Search .......... 438/612, 438/614, 617, 618, 652, 678, 619, 666; 257/E21.509, E21.587, E21.589, E21.592
See application file for complete search history.

(56) References Cited

U.S. PATENT DOCUMENTS

| | | | |
|---|---|---|---|
| 3,952,404 A | | 4/1976 | Matunami |
| 5,665,648 A | * | 9/1997 | Little ............................ 438/117 |
| 6,103,399 A | * | 8/2000 | Smela et al. .................. 428/623 |
| 7,015,584 B2 | | 3/2006 | Chow et al. |
| 7,247,035 B2 | * | 7/2007 | Mok et al. ........................ 439/81 |
| 7,456,092 B2 | * | 11/2008 | Hantschel et al. ............. 438/618 |

OTHER PUBLICATIONS

Kataoka et al., "Low Contact-Force and Compliant Mems Probe Card Utilizing Fritting Contact," IEEE, pp. 364-367, 2002.
Modi et al., "Effect of Adhesive Layer Properties on Interfacial Fracture in Thin-Film High-Density Interconnects," ECTC, San Diego, California, 2002.

\* cited by examiner

*Primary Examiner* — Julio J Maldonado
(74) *Attorney, Agent, or Firm* — Oliff & Berridge, PLC

(57) ABSTRACT

According to various exemplary embodiments, a spring device that includes a substrate, a self-releasing layer provided over the substrate and a stressed-metal layer provided over the self-releasing layer is disclosed, wherein an amount of stress inside the stressed-metal layer results in a peeling force that is higher than an adhesion force between the self-releasing layer and the stressed-metal layer. Moreover, a method of manufacturing a spring device, according to various exemplary embodiments, includes providing a substrate, providing a self-releasing layer over the substrate and providing a stressed-metal layer over the self-releasing layer wherein an amount of stress inside the stressed-metal layer results in a peeling force that is higher than an adhesion force between the self-releasing layer and the stressed-metal layer is also disclosed in this invention.

14 Claims, 12 Drawing Sheets

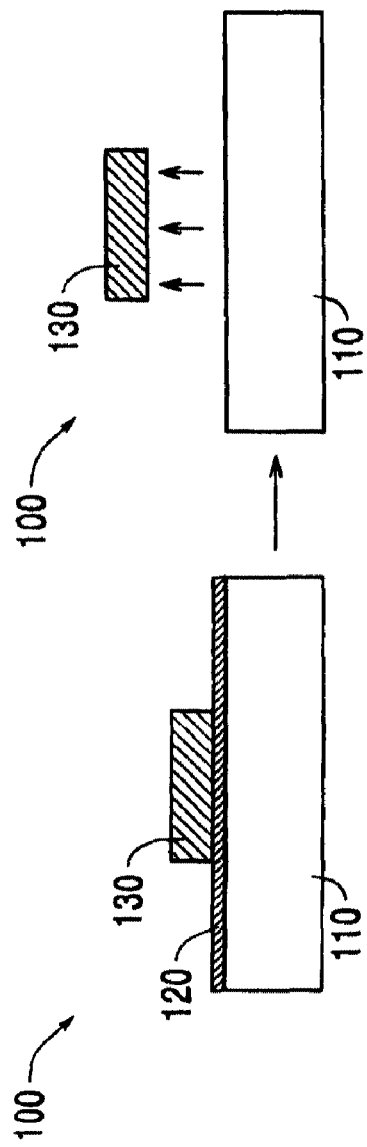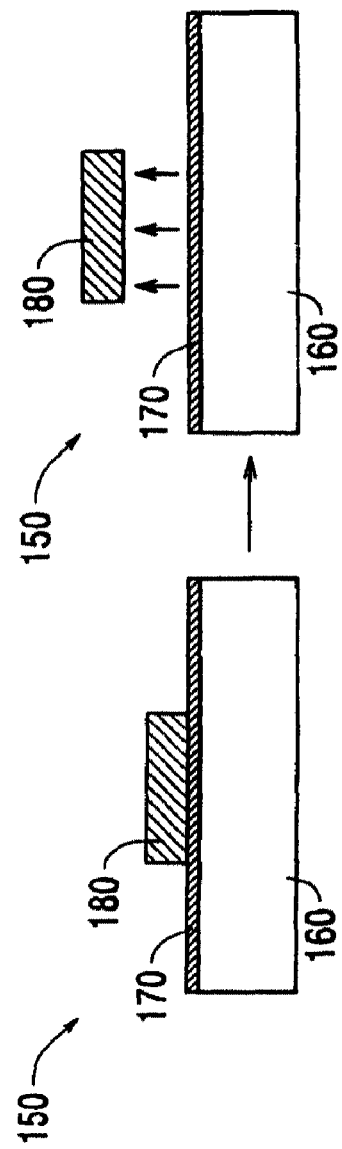
FIG. 1A
RELATED ART
FIG. 1B

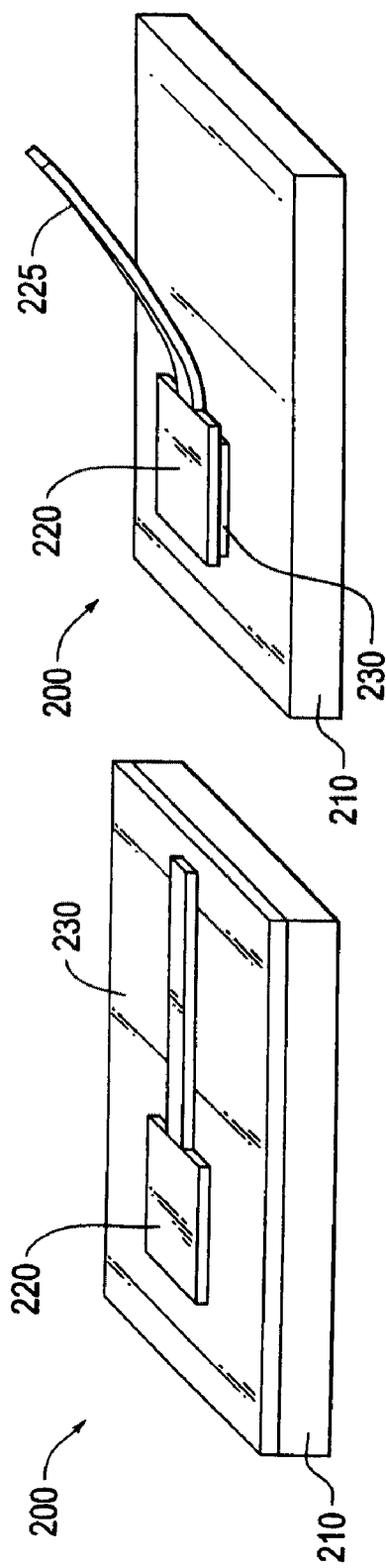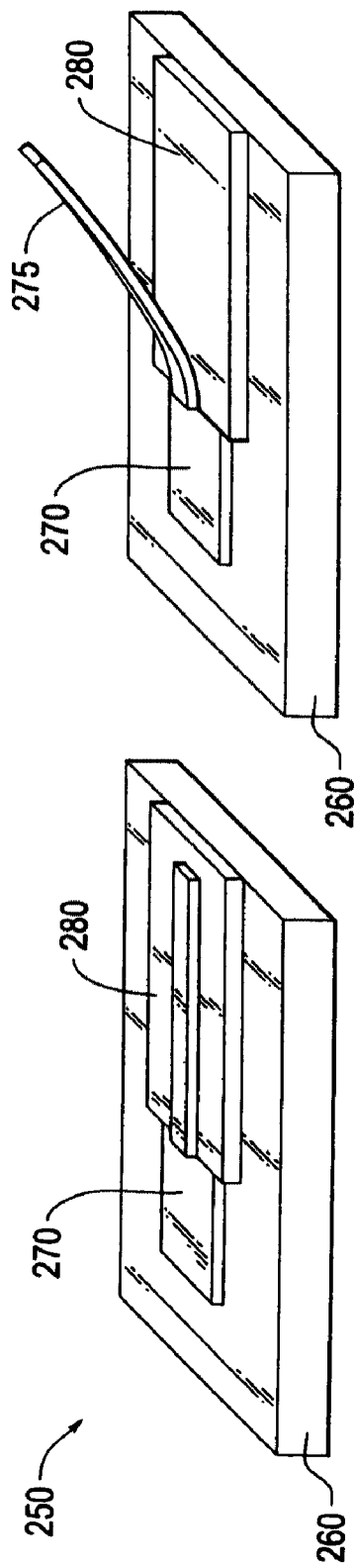

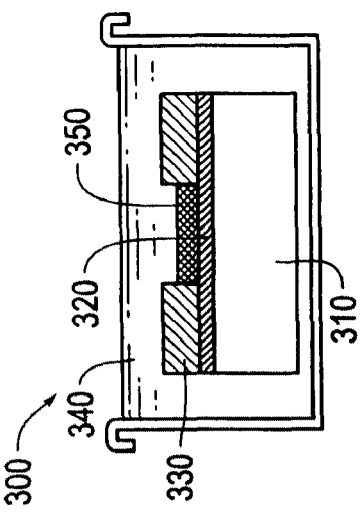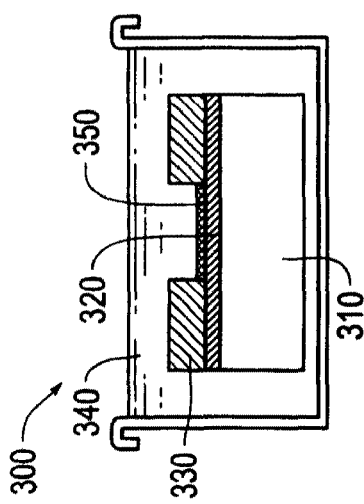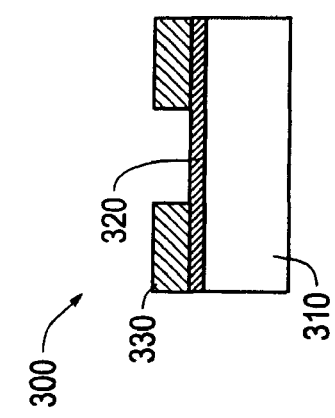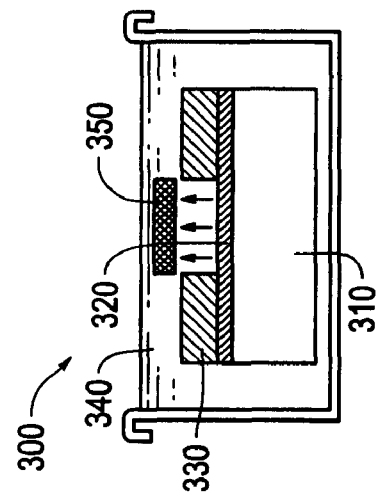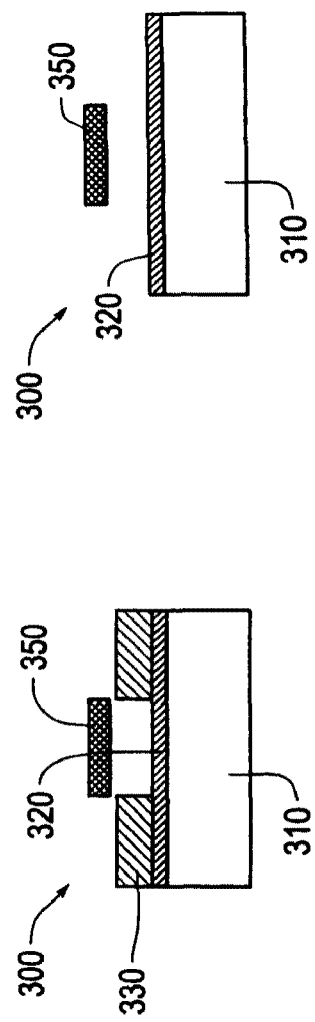

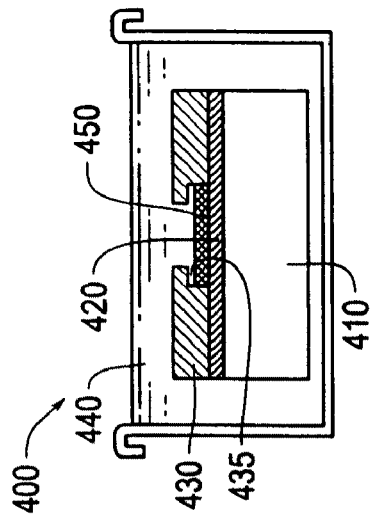
FIG. 4A
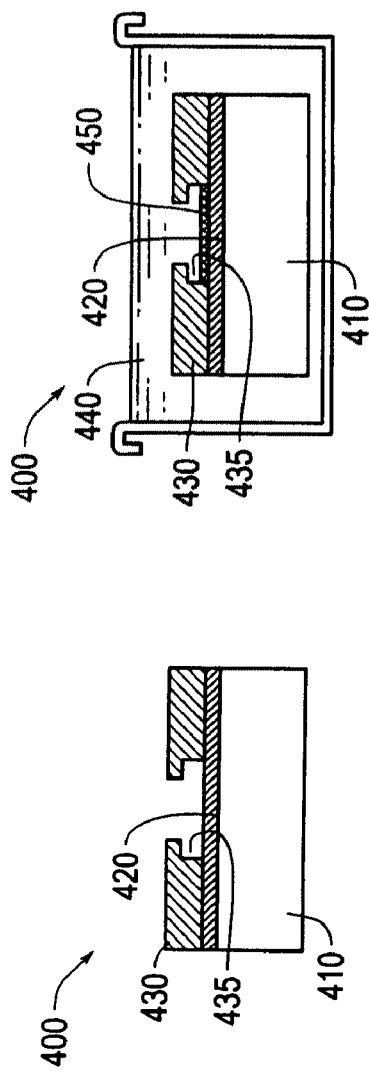
FIG. 4B
FIG. 4C
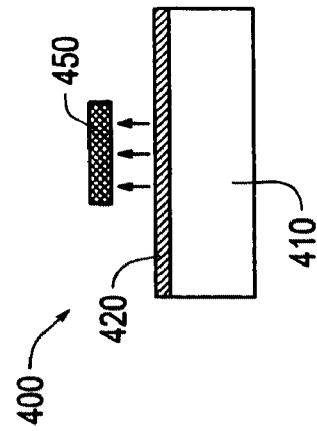
FIG. 4D
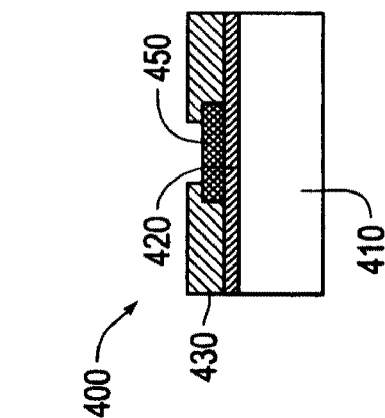
FIG. 4E
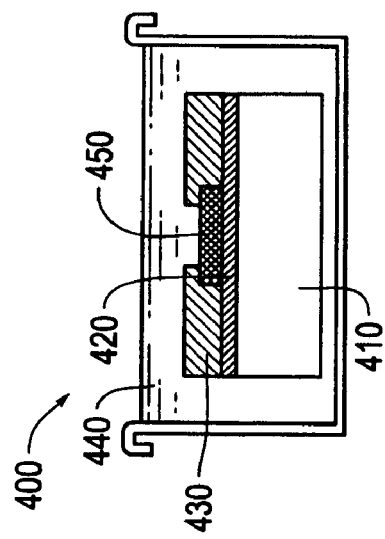
FIG. 4F

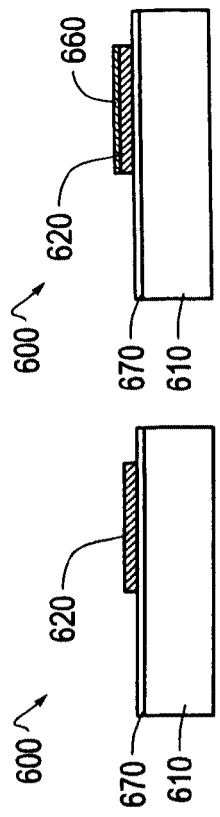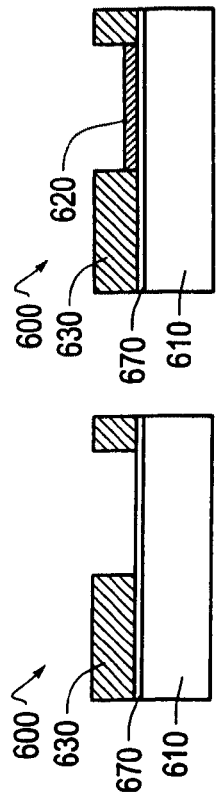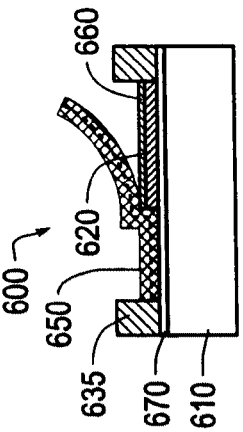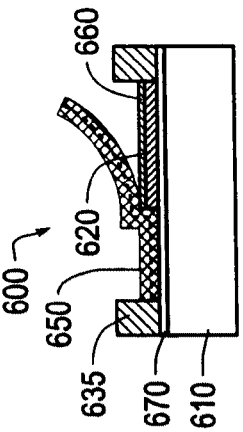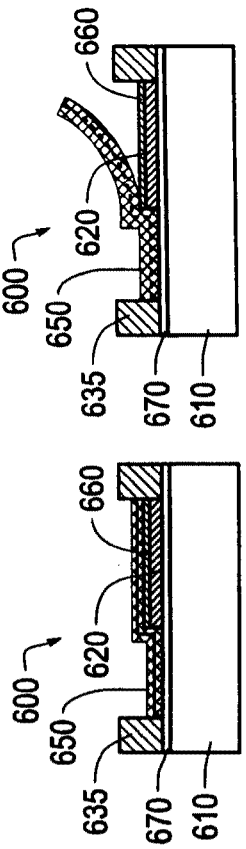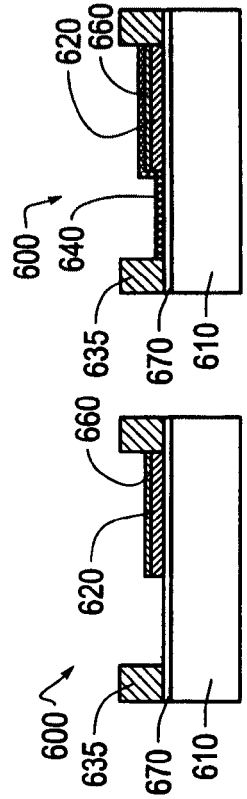

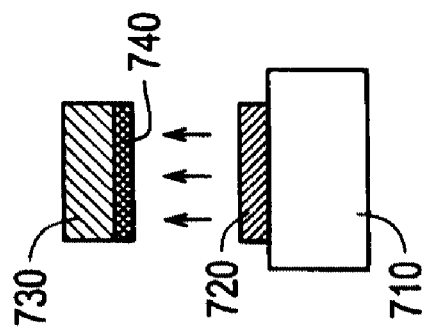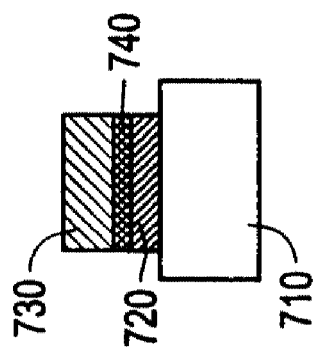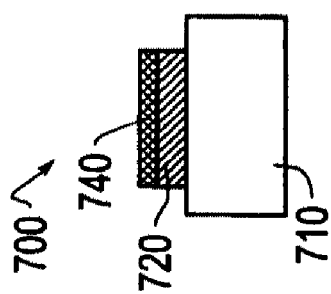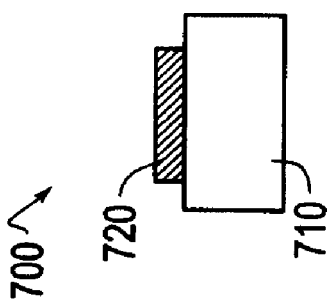

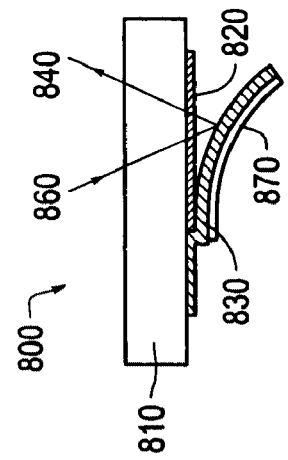
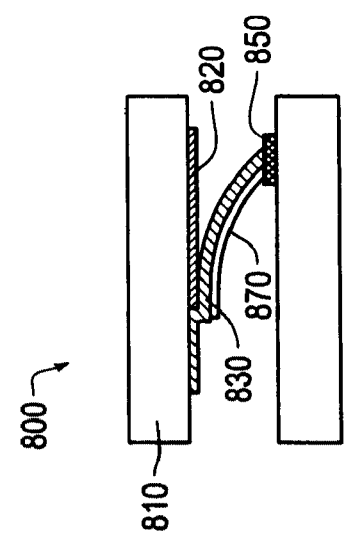
FIG. 8A  FIG. 8B  FIG. 8C
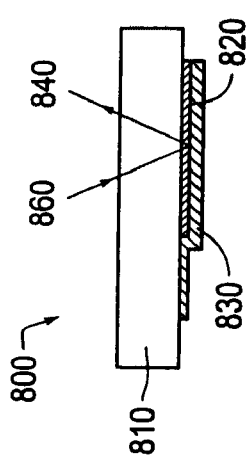
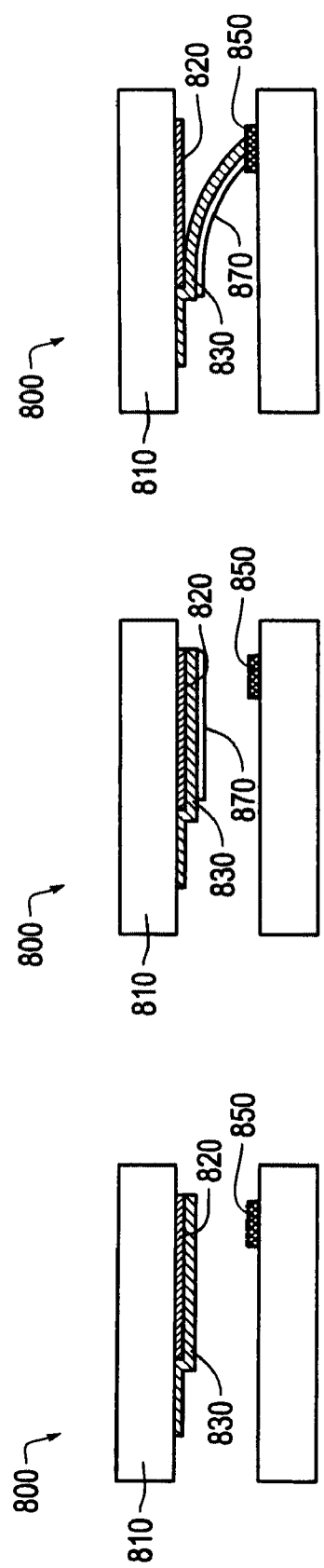
FIG. 8D  FIG. 8E  FIG. 8F

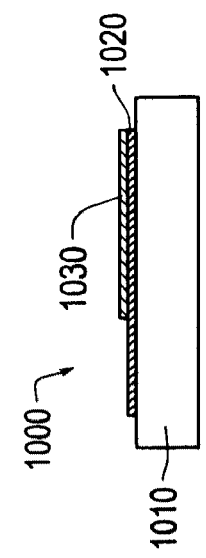
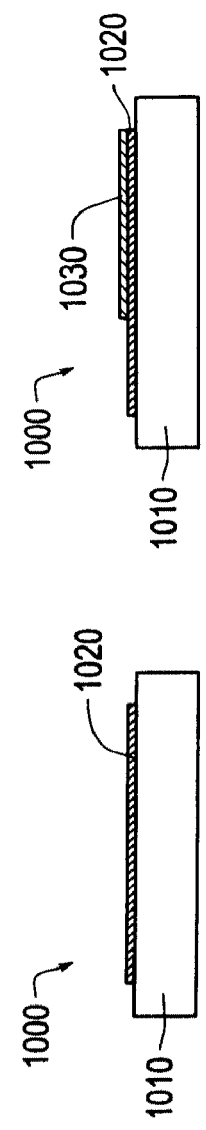
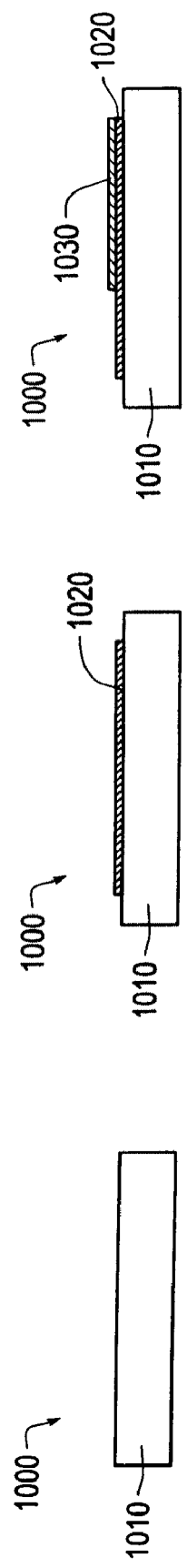
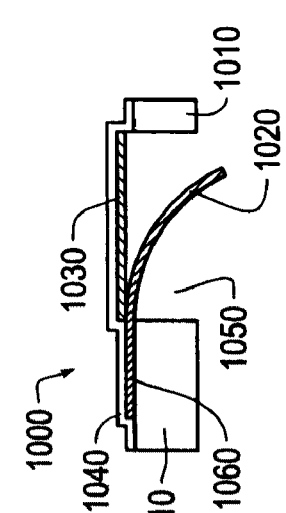
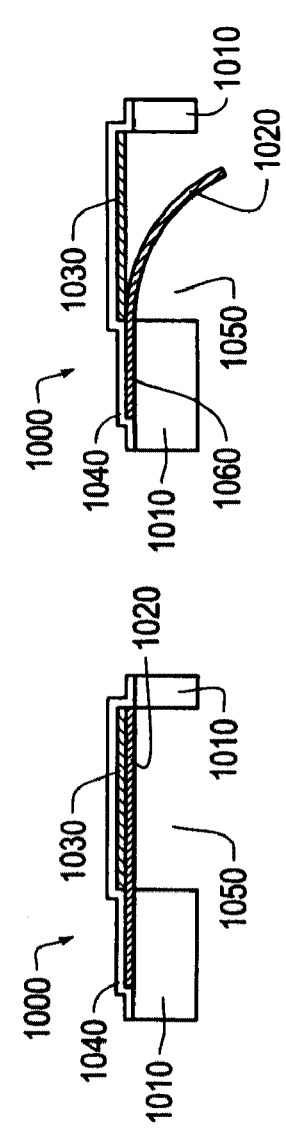
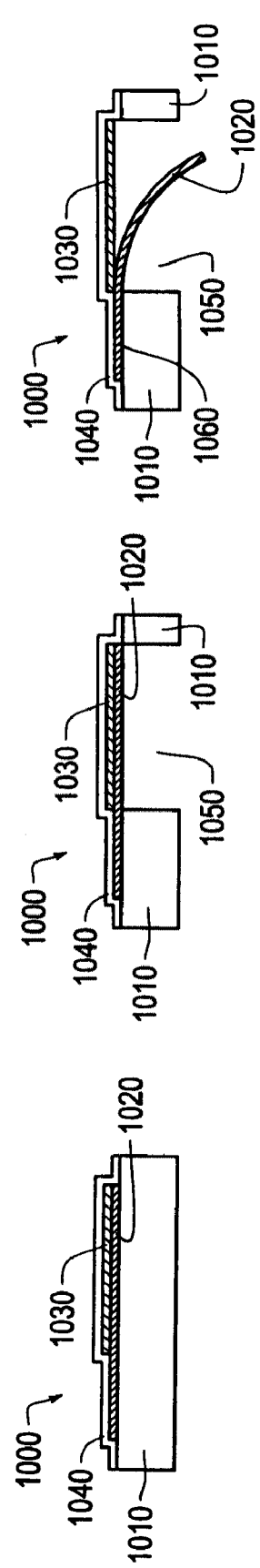

SELF-RELEASING SPRING STRUCTURES AND METHODS

This is a Division of application Ser. No. 10/959,180 filed Oct. 7, 2004. The disclosure of the prior application is hereby incorporated by reference herein in its entirety.

BACKGROUND OF THE INVENTION

1. Field of Invention

This invention relates to spring structures, and more particularly to the manufacture and use of self-releasing spring structures.

2. Description of Related Art

Spring device fabrication generally requires the use of a release etching step to lift up the springs from a substrate. Conventionally, the release etching step first implies the deposition of a release material such as, for instance, titanium, and then the use of a release etching step such as, for instance, hydrofluoric acid etching. Both of these steps incur high costs on the final product because of the additional steps in the manufacturing line. The additional steps are, for instance, a sputtering step in a sputter chamber for depositing titanium and hydrofluoric acid etching. Moreover, these additional steps can cause non-uniform spring heights because of non-uniform etching of the etched layer under the spring, and the release metal often suffers from low conductivity such as, for example, titanium (Ti). Moreover, self-aligning the springs manufactured with an etching under layer and through a release etching step is very difficult.

SUMMARY OF THE INVENTION

In light of the above described problems and shortcomings, various exemplary embodiments of the systems and methods according to this invention provide for a spring device that includes a substrate, a self-releasing layer provided over the substrate and a stressed-metal layer provided over the self-releasing layer, wherein an amount of stress inside the stressed-metal layer results in a peeling force that is higher than an adhesion force between the self-releasing layer and the stressed-metal layer.

Moreover, various exemplary embodiments of this invention also provide for a spring device that includes a substrate, a stressed-metal layer provided over the substrate and a self-releasing layer provided over the stressed-metal layer, wherein an amount of stress inside the stressed-metal layer results in a peeling force that is higher than an adhesion force between the self-releasing layer and the stressed-metal layer.

Also, various exemplary embodiments of the methods of this invention provide for a method of manufacturing a spring device that includes providing a substrate, providing a self-releasing layer over the substrate and providing a stressed-metal layer over the self-releasing layer, wherein an amount of stress inside the stressed-metal layer results in a peeling force that is higher than an adhesion force between the self-releasing layer and the stressed-metal layer.

Finally, various exemplary embodiments of the methods of this invention provide for a method of manufacturing a spring device that includes providing a substrate, providing a stressed-metal layer over the substrate and providing a self-releasing layer over the stressed-metal layer, wherein an amount of stress inside the stressed-metal layer results in a peeling force that is higher than an adhesion force between the self-releasing layer and the stressed-metal layer.

BRIEF DESCRIPTION OF THE DRAWINGS

Various exemplary embodiments of the systems and methods of this invention will be described in detail, with reference to the following figures, wherein:

FIGS. 1a-1b are diagrams illustrating a comparison between a conventional approach to releasing a spring structure from a substrate and the self-releasing approach for releasing a spring structure from a substrate, according to various exemplary embodiments of this invention;

FIGS. 2a-2d are diagrams illustrating a comparison between release etching and self-release, according to various exemplary embodiments of this invention;

FIGS. 3a-3f schematically illustrate the steps involved in the manufacture of a self-releasing spring structure according to various exemplary embodiments of this invention;

FIGS. 4a-4f schematically illustrate the steps involved in the manufacture of a self-releasing spring structure according to various exemplary embodiments of this invention;

FIGS. 6a-6h schematically illustrate the steps involved in the manufacture of a self-releasing spring structure including a low-stress layer and a high-stress layer, according to various exemplary embodiments of this invention;

FIGS. 7a-7d are diagrams illustrating the manufacture of a self-releasing spring structure including one or more capping layers, according to various exemplary embodiments of this invention;

FIGS. 8a-8f schematically illustrate the steps involved in the manufacture and detection of a self-releasing spring structure, according to various exemplary embodiments of this invention;

FIGS. 12a-12f schematically illustrate the steps involved in the manufacture of a self-releasing structure, according to various exemplary embodiments of this invention;

DETAILED DESCRIPTION OF PREFERRED EMBODIMENTS

Figure 5C:
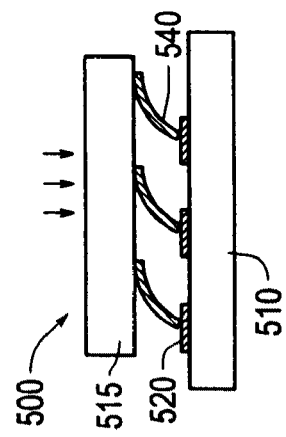
FIGS. 5a-5f schematically illustrate the steps involved in the manufacture of a self-releasing spring structure with a delay, according to various exemplary embodiments of this invention.

These and other features and advantages of this invention are described in, or are apparent from, the following detailed description of various exemplary embodiments of the systems and methods according to this invention.

FIGS. 1a-1b are diagrams illustrating a comparison between a conventional approach to releasing a spring structure from a substrate and the self-releasing approach for releasing a spring structure from a substrate, according to various exemplary embodiments of this invention. FIG. 1a, as shown in the conventional approach, illustrates the common approach, wherein the stressed-metal layer 130 is provided over the release layer 120 which is provided over a substrate 110. In the conventional approach, the release layer 120 is selectively removed by, for instance, etching, under the stressed-metal layer 130. In the case where the release layer 120 is made of a resist or a polymer, the release layer 120 can simply be dissolved. However, for a release layer 120 that is made of a metal, an oxide or a nitride, the release layer 120 is generally etched away. Generally, the dominant under-etching chemical for Ti is hydrofluoric acid (HF). HF can also be used if the release layer is silicon oxide or plasma-deposited silicon nitride. However, under-etching of the spring structure, as described above, generally causes non-uniformities in spring height, which may decrease the overall yield.

FIG. 1b illustrates the concept of self-releasing springs. In the spring structure 150, according to various exemplary embodiments, the stressed-metal layer 180 is provided over a self-releasing layer 170, which is provided over a substrate 160. The stressed-metal layer 180 is released when the amount of stress inside the stressed-metal layer 180 results in a peeling force that overcomes the adhesion force between the self-releasing layer 170 and the stressed-metal layer 180, according to various exemplary embodiments of this invention. In this case, no spring layer under-etching is needed. According to various exemplary embodiments, the control of the adhesion force between the spring or stressed-metal layer 180 and the self-releasing layer 170 is an important factor in this process. Also, although the self-releasing layer 170 appears to be made of a different material than that of the stressed-metal layer 180, in fact, both the self-releasing layer 170 and the stressed-metal layer 180 may be made of the same material. According to various exemplary embodiments, the stressed-metal layer 180 can be made out of two different metals with, for example, different thermal expansion coefficients so as to create a stress inside the layer. The right side of FIG. 1b illustrates the release of the stressed-metal layer 180 from the self-releasing layer 170 when the amount of stress in the stressed-metal layer 180 results in a peeling force that overcomes the adhesion force between the stressed-metal layer 180 and the self-releasing layer 170. As a result, the spring bends away from the substrate surface.

FIGS. 2a-2d are diagrams illustrating a comparison between release etching and self-release, according to various exemplary embodiments of this invention. In FIG. 2a, in the spring structure 200, a conventional spring release etching structure is illustrated, where the substrate 210 is covered with a release layer 230 over which a stressed-metal layer 220 is provided. FIG. 2b illustrates the case where under-etching is performed and the release layer 230 is removed, but wherein a portion of the release layer 230 located under a portion of the stressed-metal layer 220 remains. Accordingly, since a portion of the release layer 230 has not been etched, the overlaying portion of the stressed-metal layer 220 does not release from the release layer 230. As such, although a portion of the stressed-metal layer 225 is released, the remainder of the stressed-metal layer 220 is anchored on the portion of the release layer 230 that has not been etched.

In comparison, according to various exemplary embodiments, FIGS. 2c-2d illustrates a self-releasing spring structure 250 that includes a substrate 260 over which a self-releasing layer 280 and a stressed-metal layer 270 are provided. According to various exemplary embodiments, a portion of the stressed-metal layer 270 is provided directly on the substrate 260, while another portion of the stressed-metal layer 275 is provided over the self-releasing layer 280. Accordingly, when the amount of stress inside the portion of the stressed-metal layer 275 results in a peeling force that overcomes the adhesion force between the portion of the stressed-metal layer 275 and the self-releasing layer 280, then the portion of the stressed-metal layer 275 is released from the self-releasing layer 280. Moreover, according to various exemplary embodiments, the portion of the stressed-metal layer 270 that is provided directly on the substrate 260 is not released from the substrate 260 because the stress gradient in the stressed-metal layer 270 does not results in a peeling force that overcomes the adhesion force between the stressed-metal layer 270 and the substrate 260. As such, the portion of the stressed-metal layer 270 is anchoring the portion of the stressed-metal layer 275 that has been released from the self-releasing layer 280.

FIGS. 3a-3f schematically illustrate the steps involved in the manufacture of a self-releasing spring structure 300 according to various exemplary embodiments of this invention. In FIG. 3a, a substrate 310 is illustrated, the substrate 310 being covered by a self-releasing layer 320 which is partially covered by a resist 330 in the self-releasing spring structure 300. According to various exemplary embodiments, a stressed-metal layer 350 is formed on the self-releasing layer 320 by plating in a plating bath 340 (FIG. 3b). Also as illustrated in FIG. 3c, the thickness of the stressed-metal layer 350 increases, but the adhesion force between the stressed-metal layer 350 and the self-releasing layer 320 is not yet overcome by the peeling force that is the result of the stress built up inside the stressed-metal layer 350 during plating. According to various exemplary embodiments, electroless plating or electroplating methods can be used to provide the stressed-metal layer 350. According to various exemplary embodiments, metals such as nickel and copper, or alloys such as nickel-phosphorus and nickel-boron, are preferred. Other metals such as, for example, zinc, gold, tin, palladium, cobalt, chromium or rhodium, or alloys thereof, can be used as well. According to various exemplary embodiments, the stressed-metal layer can be formed out of one metal or alloy, and it can be formed by two or more metals or alloys. In the case of electroplating, for example, the stressed-metal layer can be formed using one plating bath or using more than one plating bath, where each plating bath confers different characteristics to the stressed-metal layer. Accordingly, due to the controlled parameters of plating such as, for example, current density, the stress gradient, or strain gradient, and the mechanical moment in the stressed-metal layer 350 increase during plating, and eventually the adhesion force between the stressed-metal layer 350 and the self-releasing layer 320 is overcome by the peeling force that is the result of the stress built up inside the stressed-metal layer 350 during plating. As a result, the stressed-metal layer 350 is released from the self-releasing layer 320 into the plating bath 340 (FIG. 3d). According to various exemplary embodiments, the stressed-metal layer 350 can be made out of two different metals with, for example, different thermal expansion coefficients so as to create a stress inside the layer.

According to various exemplary embodiments, the self-releasing layer 320 can be over-plated in order to stiffen the stressed-metal layer 350, which prevents the stressed-metal layer 350 from sticking down during drying of the stressed-metal layer 350. It should be noted that the sticking down of the stressed-metal layer 350 is a known yield problem that exists for the conventional spring etching approach. Moreover, over-plating may also be used in order to, for example, increase the conductivity of the stressed-metal layer 350 or to improve the hardness and wear resistance of the released stressed-metal layer 350. When the stressed-metal layer is released from the self-releasing layer 320, then the substrate 310, the stressed-metal layer 350 and the resist 330 are dried and the resist 330 is then stripped (FIGS. 3e-3f).

FIGS. 4a-4f schematically illustrate the steps involved in the manufacture of a self-releasing spring structure 400 according to various exemplary embodiments of this invention. In the spring structure 400, a substrate 410 is illustrated, over which a self-releasing layer 420 and a resist 430 are provided. According to various exemplary embodiments, the shape of the resist 430 is designed so as to exhibit a recess 435 (FIG. 4a). According to various exemplary embodiments, the recess can be achieved, for example, by using a double-layer resist structure. Alternatively, a single resist structure with a negative side slope may be used such as, for example, an image reversal process using a Shipley 1800 resist. According to various exemplary embodiments, the spring structure 400 is disposed in a plating bath 440 in order to plate a stressed-metal layer 450 on the self-releasing layer 420 (FIG. 4b). Accordingly, a thickening layer of stressed-metal layer 450 is formed by plating until the stressed-metal layer 450 reaches the recess 435 of the resist 430 (FIG. 4c-4d). As such, when the spring structure 400 is removed from the plating bath and dried (FIG. 4e), and when the resist 430 is stripped (FIG. 4f), then the stressed-metal layer 450 is finally released.

According to various exemplary embodiments, the thickness and stress of the stressed-metal layer 450 can be increased during plating (FIG. 4c-4d) by controlling different process parameters such as, for example, current density, or by using more than one plating bath with different stress characteristics. It should be noted that the thickness of the stressed-metal layer 450 can be smaller, equal to or larger than the height of recess 435. Eventually, the adhesion force between the stressed-metal layer 450 and the self-releasing layer 420 is overcome by the peeling force that results from the stress built up inside the stressed-metal layer 450 during plating. According to various exemplary embodiments, the spring structure 400 is then removed from the plating bath 440 and is then dried (FIG. 4e). The resist 430 is then stripped whereby stressed-metal layer 450 is released (FIG. 4f). It should be noted that the drying illustrated on FIG. 4e can also be skipped.

One advantage of the manufacturing line illustrated in FIG. 4 is, according to various exemplary embodiments, the ability to clamp down the stressed-metal layer 450 during plating and to keep it on the self-releasing layer 420 until it reaches a desired thickness which is defined by the recess 435. Although the amount of strain inside the stressed-metal layer 450 may be enough to overcome the adhesion force between the stressed-metal layer 450 and the self-releasing layer 420 before the recess 435 is completely filled, the stressed-metal layer 450 is clamped down on the self-releasing layer 420 by the recess 435 until it reaches the desired thickness defined by the height of the recess 435. According to various exemplary embodiments, the stressed-metal layer 450 can be made out of two different metals with, for example, different thermal expansion coefficients so as to create a stress inside the layer.

Figure 5F:
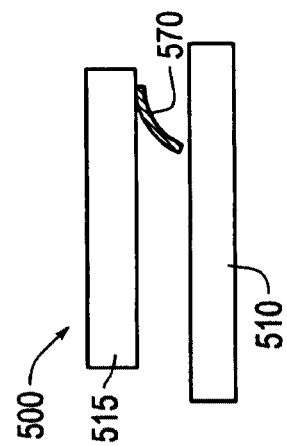
Figure 5B:
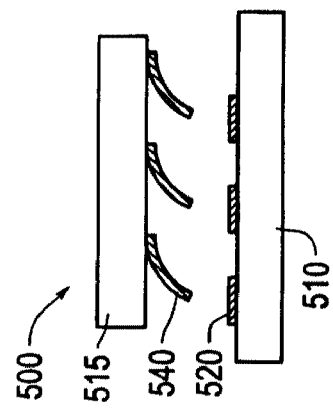
Figure 5E:
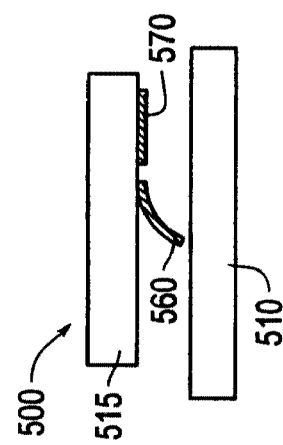
Figure 5A:
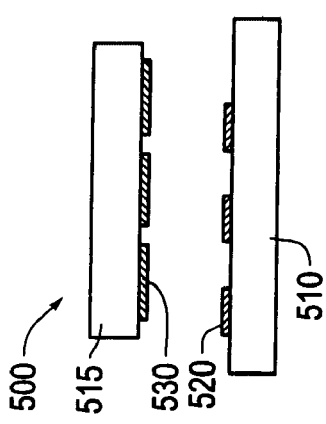
Figure 5D:
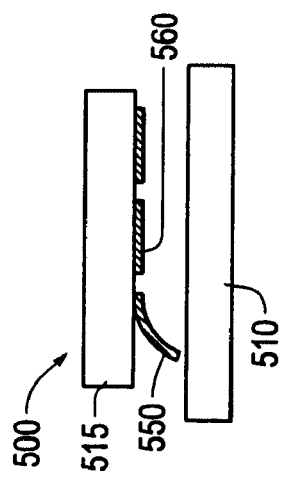

FIGS. 5a-5f schematically illustrate the steps involved in the manufacture of a self-releasing spring structure 500 with a delay, according to various exemplary embodiments of this invention. According to various exemplary embodiments, a self-releasing spring structure 500 is illustrated in FIG. 5a, where a first substrate 510 is covered with pads 520, and a second substrate 515, over which a spring structure 530 is provided, the spring structure 530 including a stressed-metal layer 540. According to various exemplary embodiments, the self-releasing spring structure 500 illustrates a device assembly where the release of the stressed-metal layer 540 is delayed until a specific assembly step such as, for example, when the first substrate 510 and the pads 520 arrive in the proximity of the second substrate 515 and the spring 530. At that moment, the spring 530 releases the stressed-metal layer 540 (FIG. 5b) and the stressed-metal layer 540 enters into contact with the pads 520.

According to various exemplary embodiments, the time of release of the stressed-metal layer 540 is triggered by, for example, heat, laser light, vibrations or resist clamping. According to various exemplary embodiments, the stressed-metal layer 540 is clamped down by a recess or resist with negative side profile. In other words, similarly to FIG. 4 where the release of the stressed-metal layer 450 is delayed because of the clamping of the resist 430, in FIG. 5, the release of the stressed-metal layer 540 is delayed until the clamping is overcome by, for example, resist stripping, dissolving or plasma etching, or by resist reflow using, for example, direct heating or laser light to heat the resist above glass-transition temperature and change the resist profile or the recess shape and causes the stressed-metal layer to release.

According to various exemplary embodiments, the same principle can be applied to the replacement of, for example, springs 550 (FIG. 5d) where, when a spring 550 that ensures mechanical or electrical contact between a first substrate 510 and a second substrate 515 is used up, then the trigger is activated on another spring 560, by, for example, heat, laser light, or vibration, and the spring 560 is then released and can then be used to ensure mechanical or electrical contact between the first substrate 510 and the second substrate 515 (FIG. 5e) while the spring 550 is, for example, removed. Accordingly, when the spring 560 is used up, then the same mechanism can be used for another substrate 570, according to various exemplary embodiments (FIG. 5f). According to various exemplary embodiments, an application of this principle is in scanning probe arrays. The purpose of such an application is to release one spring at a time and to use it for scanning applications. The tip is initially sharp and scans over a sample surface while recording topography at the nanometer scale or do electrical measurements on nanometer scale, but it wears out over time. According to various exemplary embodiments, the worn-out tip is then broken off and a fresh and sharp tip is released out of the resist with recess clamping mold using, for example, a high-power laser that heats up the resist above glass-transition temperature.

FIGS. 6a-6h schematically illustrate the steps involved in the manufacture of a self-releasing spring structure 600 including a low-stress layer and a high-stress layer, according to various exemplary embodiments of this invention. In FIGS. 6a-6h, a self-releasing spring structure 600 is illustrated, where a substrate 610, according to various exemplary embodiments, is covered with a plating seedlayer 670 such as, for example, gold. According to various exemplary embodiments, the substrate 610 and the plating seedlayer 670 are partially covered with a resist 630 (FIG. 6a). A metal layer 620 such as, for example, nickel, is then formed by plating onto the exposed portion of the plating seedlayer 670 (FIG. 6b), and the resist 630 is then stripped (FIG. 6c). According to various exemplary embodiments, an oxide layer 660 such as, for example, nickel oxide, is then formed by oxidation of the metal layer 620 (FIG. 6d). According to various exemplary embodiments, the substrate 610 is then covered partially with another resist 635 to define an area where the spring structure is to be formed (FIG. 6e).

According to various exemplary embodiments, a low stress metal layer 640 is provided over both the oxide layer 660 and the plating seedlayer 670 (FIG. 6f). Accordingly, a portion of the low stress metal layer 640 covers the plating seedlayer 670 and a portion of the low stress metal layer 640 covers the oxide layer 660. According to various exemplary embodiments, the low stress layer 640 is made of nickel, copper or alloys thereof.

According to various exemplary embodiments, a high stress metal layer 650 is provided over the low stress metal layer 640 (FIG. 6g). According to various exemplary embodiments, the high stress metal layer 650 is made of nickel, copper or alloys thereof. As a result, a metal layer composed of the low stress metal layer 640 and the high stress metal layer 650 is formed and contains a stress gradient ranging from the low stress of the low stress metal layer 640 to the high stress of the high stress metal layer 650. According to various exemplary embodiments, when the stress gradient in the layer formed of layer 640 and 650 results in a peeling force that overcomes the adhesion force between the low stress metal layer 640 and the oxide layer 660, then the low stress metal layer 640 and the high stress layer 650 are released from the oxide layer 660 (FIG. 6h). However, because the stress gradient in the layer formed of both layers 640 and 650 is not enough, according to various exemplary embodiments, to result in a peeling force that overcome the adhesion force between the plating seedlayer 670 and the low stress layer 640, then the portion of the low stress metal layer 640 that covers the plating seedlayer 670 remains anchored on the substrate and is not released (FIGS. 6g-6h).

According to various exemplary embodiments, the high stress metal layer 650 needs simply to have a higher stress than the low stress metal layer 640. For example, the low stress metal layer 640 can be in a compressive stress, which corresponds to a negative stress, while the high stress layer 650 has no stress, and the combination of the high stress layer 650 and the low stress layer 640 results in a stress gradient across both layers. Moreover, according to various exemplary embodiments, the plating seedlayer 670 can also be provided over the layers 640 and 650.

FIGS. 7a-7d are diagrams illustrating the manufacture of a self-releasing spring structure 700 including one or more capping layers, according to various exemplary embodiments of this invention. According to various exemplary embodiments, these capping layers serve, for example, as seedlayers for the plating of the stressed-metal layer 730. In FIG. 7a, a self-releasing layer 720, provided on a substrate 710, is covered with a capping layer 740 (FIG. 7b). A stressed-metal layer 730 is then provided over the capping layer 740 (FIG. 7c). According to various exemplary embodiments, the adhesion force between the capping layer 740 and the stressed-metal layer 730 is higher than the adhesion force between the capping layer 740 and the self-releasing layer 720. Hence, according to various exemplary embodiments, the stressed-metal layer 730, together with the capping layer 740, are released from the self-releasing layer 720 when the stress in the stressed-metal layer 730 results in a peeling force that overcomes the adhesion force between the self-releasing layer 720 and the capping layer 740. It should be noted that, according to various exemplary embodiments, more than one capping layer can be used.

FIGS. 8a-8f schematically illustrate the steps involved in the manufacture and detection of a self-releasing spring structure 800, according to various exemplary embodiments of this invention. In FIGS. 8a-8f, a self-releasing spring structure 800 is illustrated where a self-releasing layer 820 and a stressed-metal layer 830 are provided over a substrate 810. According to various exemplary embodiments, the self-releasing spring structure 800 is disposed in a specific environment which can influence either the peeling force that is the result of the stress gradient within the stressed-metal layer 830 or the adhesion force between the self-releasing layer 820 and the stressed-metal layer 830. Accordingly, a light 860 such as, for example, a laser light, is shone on the stressed-metal layer 830 through the substrate 810 and the self-releasing layer 820 and the reflection of the light is then detected by a detector 840. According to various exemplary embodiments, the substrate 810 such as, for example, glass or quartz, and the self-releasing layer 820 such as, for example, a thin oxide layer, are transparent to the light 860. As such, when the environment in which the self-releasing spring structure 800 is disposed reacts with the self-releasing spring structure 800 and influences the state of the stressed-metal layer 830 by changing the stress or strain gradient within the stressed-metal layer 830, or by changing the adhesion force between the stressed-metal layer 830 and the self-releasing layer 820, then the stressed-metal layer 830 will release from the self-releasing layer 820. Accordingly, the release of the stressed-metal layer 830 will be detected by the detector 840, and information on the environment in which the self-releasing spring structure 800 is disposed can then be gathered (FIGS. 8a-8c). According to various exemplary embodiments, a layer 870, which can be an organic layer or an inorganic layer, is provided over the stressed-metal layer 830 (FIG. 8b), and may cause a change in the stress or strain gradient of the stressed-metal layer 830, thus influencing the release of the stressed-metal layer 830.

According to various exemplary embodiments, similar applications can be performed where, for example, a specific environment in which the self-releasing spring structure 800 is disposed will activate the release of the stressed-metal layer 830, thereby creating an electrical contact between the stressed-metal layer 830 and an electrical contact pad 850 (FIGS. 8d-8f). According to various exemplary embodiments, the detector 840 can be any of a number of detection systems based on light detection, capacitive detection, piezoresistive detection, electrical contact, and the like.

Figure 9D:
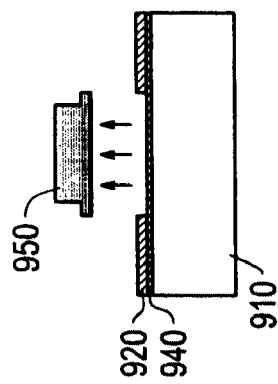
FIGS. 9a-9d schematically illustrate the steps involved in the manufacture of a self-releasing spring structure, according to various exemplary embodiments of this invention.
Figure 9C:
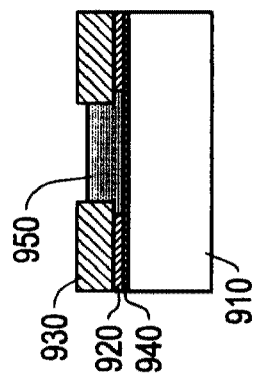
Figure 9B:
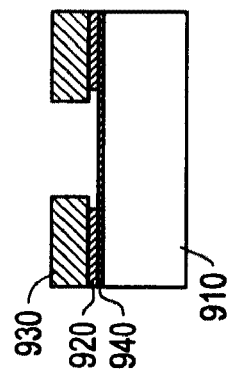
Figure 9A:
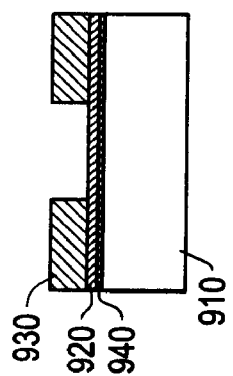

FIGS. 9a-9d schematically illustrate the steps involved in the manufacture of a self-releasing spring structure 900, according to various exemplary embodiments of this invention. In FIGS. 9a-9d, a self-releasing spring structure 900 is illustrated, where a self-releasing layer 940 is provided over a substrate 910 and is partially covered with a resist 930. According to various exemplary embodiments, a clamping-mold layer 920 is provided between the self-releasing layer 940 and the resist 930. According to various exemplary embodiments, a portion of the clamping-mold layer 920 is etched away in order to define a recess shape between the resist 930 and the self-releasing layer 940 (FIG. 9b). According to various exemplary embodiments, the height of the recess shape is controlled by the thickness of the clamping-mold layer 920 and the width of the recess shape is controlled by the etching time and concentration of the etching solution. According to various exemplary embodiments, a stressed-metal layer 950 is plated over the self-releasing layer 940 in such a way as to fill all the space available between the self-releasing layer 940 and the resist 930. When the stressed-metal layer 950 is plated, according to various exemplary embodiments, the resist 930 is stripped and the stressed-metal layer 950 is released (FIG. 9d). According to various exemplary embodiments, the clamping-mold layer 920 can be made, for example, out of titanium, gold, nickel, oxide or nitride, and the self-releasing layer 940 can be made, for example, out of metal, oxide, nitride or organic material.

Figure 10:
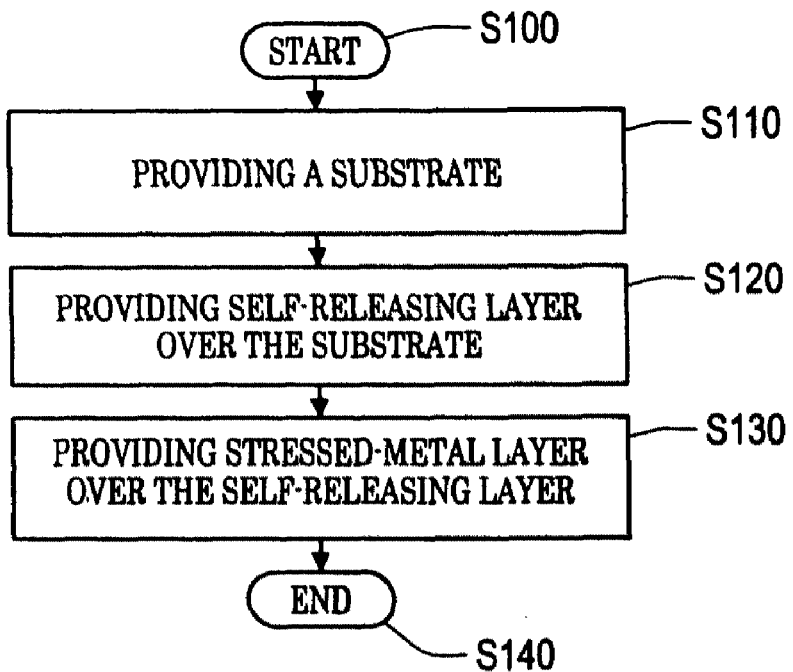
FIG. 10 is a flowchart illustrating a method of manufacturing a self-releasing spring structure, according to various exemplary embodiments of this invention.

FIG. 10 is a flowchart illustrating a method of manufacturing a self-releasing spring structure, according to various exemplary embodiments of this invention. The method starts in step S100 and continues to step S110, during which a substrate is provided. After the substrate is provided during step S110, a self-releasing layer is provided over the substrate during step S120. Next, control continues to step S130, where a stressed-metal layer is provided over the self-releasing layer. According to various exemplary embodiments, the stress gradient inside the stressed-metal layer is such that it results in a peeling force that overcomes the adhesion force between the self-releasing layer and the stressed-metal layer. Accordingly, when the adhesion force between the stressed-metal layer and the self-releasing layer is overcome by the peeling force as a result of the stress gradient inside the stressed-metal layer, then the stressed-metal layer releases from the self-releasing layer. Next, control continues to step S140, where the method ends.

According to various exemplary embodiments, when the stressed-metal layer is provided during step S130, a portion of the stressed-metal layer can also be directly provided over the substrate. As such, a portion of the stressed-metal layer is provided over the self-releasing layer and over the substrate. As a result, according to various exemplary embodiments, when the adhesion force between the self-releasing layer and the stressed-metal layer is overcome by the peeling force that is the result of the stress gradient inside the self-releasing layer, the portion of the stressed-metal layer that is directly provided over the substrate is not affected by the release of the portion of the stressed-metal layer that is provided over the self-releasing layer. Accordingly, the portion of the stressed-metal layer that is directly provided over the substrate anchors the release of the stressed-metal layer.

According to various exemplary embodiments, after providing the self-releasing layer over the substrate during step S120, and before providing the stressed-metal layer over the self-releasing layer during step S130, a patterned mask material such as, for example, a patterned resist, may be provided over the self-releasing layer in order to outline a specific area where the stressed-metal layer can then be provided. According to various exemplary embodiments, the patterned mask material can then be removed after the stressed-metal layer is provided over the self-releasing layer during step S130.

According to various exemplary embodiments, a clamping structure can be provided in order to clamp the stressed-metal layer to the self-releasing layer even after the release of the stressed-metal layer from the self-releasing layer has taken place. According to various exemplary embodiments, the stressed-metal layer can be released from the self-releasing layer after a delay. A delay, according to various exemplary embodiments, can be effected by providing a self-releasing layer during step S120 with a stress gradient that is high, but not enough to result in a peeling force that overcomes the adhesion force between the self-releasing layer and the stressed-metal layer, but the stress gradient can be increased by exciting the self-releasing layer with, for instance, heat, laser, vibrations, a defect, chemical reactions, or biological substances that are bound to the stressed-metal layer and, because of the increase, overcome the adhesion force between the self-releasing layer and the stressed-metal layer.

According to various exemplary embodiments, while providing the stressed-metal layer over the self-releasing layer during step 130, the process parameters such as, for example, plating parameters, are controlled in such a way as to create a stress gradient in the self-releasing layer. For example, the stress gradient can be created by having a stressed-metal layer comprising a low-stress layer and a high-stress layer, wherein the high-stress layer is provided over the low-stress layer, so that the resulting amount of stress in the overall stressed-metal layer defines a stress gradient which results in a peeling force that bends the self-releasing spring structure away from the substrate surface.

Moreover, according to various exemplary embodiments, the stressed-metal layer can also be provided during step S130 via, for example, plating, sputtering, chemical vapor deposition, plasma enhanced chemical vapor deposition, evaporation, a combination of one or more of plating, sputtering, chemical vapor deposition, plasma enhanced chemical vapor deposition and evaporation, and the like. The stressed-metal layer can also be made out, according to various exemplary embodiments, of two different metals with, for example, different thermal expansion coefficients so as to create a stress inside the layer.

According to various exemplary embodiments, one or more capping layers can be provided between the self-releasing layer and the stressed-metal layer. The capping layers can be used, for example, as plating seedlayers, and also to improve the adhesion.

When the stressed-metal layer is provided over the self-releasing layer during step S130, control continues to step S140, where the method ends.

According to various exemplary embodiments, the release of the stressed-metal layer from the self-releasing layer is detected by a detection system that can be any one of light detection, capacitive detection, piezoresistive detection, electric detection, magnetic detection, and the like. Also, according to various exemplary embodiments, when a patterned photoresist is used to delineate a specific shape or thickness of the stressed-metal layer, and when the patterned photoresist defines a recess that prevents the stressed-metal layer from being released from the self-releasing layer, then the stressed-metal layer is released from the self-releasing layer after the patterned photoresist is removed by, for example, stripping.

Figure 11:
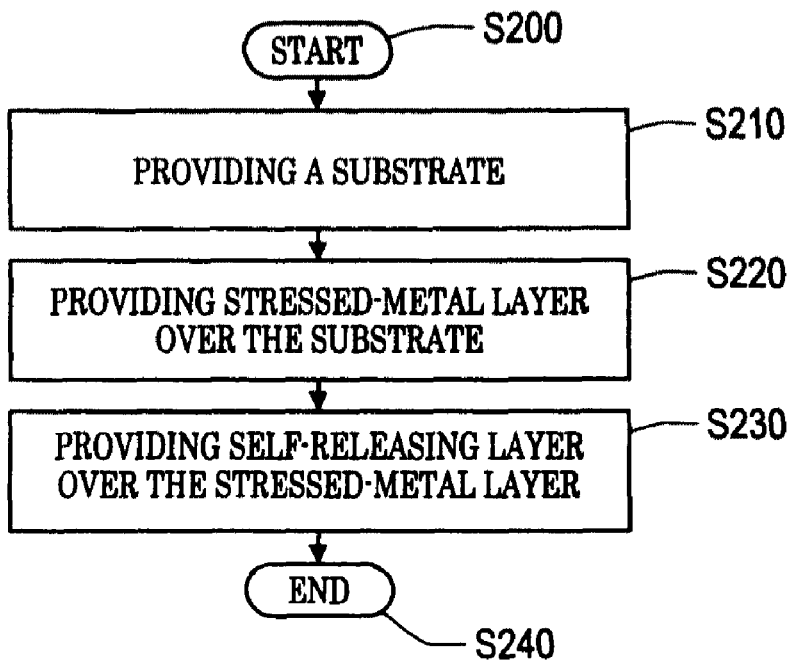
FIG. 11 is a flowchart illustrating a method of manufacturing a self-releasing spring structure, according to various exemplary embodiments of this invention.

FIG. 11 is a flowchart illustrating a method of manufacturing a self-releasing spring structure according to various exemplary embodiments of this invention. In FIG. 11, the method starts in step S200 and continues to step S210. During step S210, a substrate is provided. Next, control continues to step S220, where a stressed-metal layer is provided over the substrate. Next, control continues to step S230, where a self-releasing layer is provided over the stressed-metal layer. Next, control continues to step S240, where the method ends.

FIGS. 12a-12f schematically illustrate the steps involved in the manufacture of a self-releasing spring structure 1000, according to various exemplary embodiments of this invention. In FIGS. 12a-12f, a self-releasing spring structure 1000 is illustrated where a stressed-metal layer 1020 is provided over a substrate 1010 (FIG. 12b). According to various exemplary embodiments, the substrate 1010 can be, for example, silicon, glass or quartz. According to various exemplary embodiments, a self-releasing layer 1030 which can be, for example, a thin oxide layer, is then provided over the stressed-metal layer 1020 (FIG. 12c). Moreover, a topcoating 1040 is provided over the self-releasing layer 1030 and the substrate 1010 (FIG. 12d).

According to various exemplary embodiments, an opening 1050 is provided in the substrate 1010 (FIG. 12e). Accordingly, when the stress built up in the stressed-metal layer 1020 results in a peeling force that becomes higher than the adhesion force between the stressed-metal layer 1020 and the self-releasing layer 1030, then the stressed-metal layer 1020 separates form the self-releasing layer 1030 by, for example, delamination, and bends downwards (FIG. 12f). According to various exemplary embodiments, the stressed-metal layer 1020 bends downwards and is anchored by the substrate 1010 that prevents a portion 1060 of the stressed-metal layer 1020 from separating from the self-releasing layer 1030.

Figure 13A:
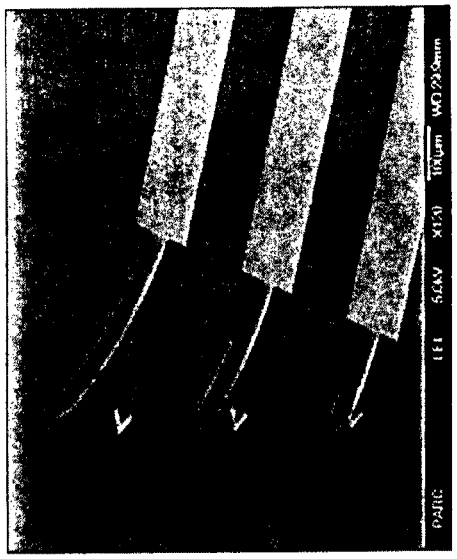
FIGS. 13a-13b are photographs of self-releasing spring structures according to various exemplary embodiments of this invention.
Figure 13B:

FIGS. 13*a*-13*b* are photographs of self-releasing spring structures according to various exemplary embodiments of this invention. FIG. 13*a* shows a scanning electron microscope (SEM) photograph of a self-releasing spring structure after self-release has taken place in the plating bath, with the resist still in place. FIG. 13*b* shows a SEM photograph of a self-releasing spring structure after self-release has taken place in the plating bath, and after the resist has been stripped.

Figure 14:
FIG. 14 is a photograph of a self-releasing spring structure according to various exemplary embodiments of this invention.

FIG. 14 is a photograph of a self-releasing spring structure according to various exemplary embodiments of this invention. FIG. 14 shows a SEM photograph of prototype springs where the self-release has been delayed by using a resist with a negative side profile. According to various exemplary embodiments, the resist was stripped after the plating of the stressed-metal layer, and as a result, the springs were released similarly, for example, to the illustration in FIG. 4*f*.

While the invention has been described in conjunction with exemplary embodiments, these embodiments should be viewed as illustrative, not limiting. Various modifications, substitutes, or the like are possible within the spirit and scope of the invention.

What is claimed is:

1. A method of manufacturing a spring device, comprising:
providing a substrate;
providing a self-releasing layer over the substrate;
providing a stressed-metal layer over the self-releasing layer; and
increasing an amount of the stressed-metal layer until a total amount of stress inside the stressed-metal layer becomes greater than an adhesion force between the self-releasing layer and the stressed-metal layer, resulting in the stressed-metal layer being released from the self-releasing layer.

2. The method of claim 1, wherein:
at least a portion of the stressed-metal layer is directly provided over the substrate.

3. The method of claim 1, wherein:
a patterned mask is provided over the self-releasing layer to outline an area where the stressed-metal layer is provided.

4. The method of claim 3, wherein:
the patterned mask is removed after the stressed-metal layer is provided.

5. The method of claim 1, wherein:
the stressed-metal layer is provided via one of at least plating, sputtering, chemical vapor deposition, plasma-enhanced chemical vapor deposition, evaporation, and a combination of one or more of plating, sputtering, chemical vapor deposition, plasma-enhanced chemical vapor deposition, and evaporation.

6. The method of claim 1, wherein:
one or more capping layers are provided between the self-releasing layer and the stressed-metal layer.

7. The method of claim 6, wherein:
the one or more capping layers adhere to the stressed-metal layer after the release of the stressed-metal layer.

8. The method of claim 1, wherein:
the stressed-metal layer comprises two or more stressed layers that form a stress gradient across the stressed-metal layer.

9. A method of manufacturing a spring device, comprising:
providing a substrate;
providing a self-releasing layer over the substrate;
disposing a resist over the self-releasing layer, the resist defining an opening, the opening being wider at an upper portion of the self-releasing layer and narrower at an upper portion of the resist so as to define a recess in the resist, the resist with the recess forming a clamping structure;
disposing a stressed-metal layer through the opening, over the self-releasing layer, until the stressed-metal layer reaches an upper portion of the recess, wherein an amount of stress inside the stressed-metal layer is in the form of a stress gradient;
increasing the stress gradient of the stressed-metal layer, the amount of stress inside the stressed-metal layer becomes greater than an adhesion force between the self-releasing layer and the stressed-metal layer, resulting in the stressed-metal layer being released from the self-releasing layer.

10. The method of claim 9, wherein:
the stressed-metal layer is provided by a plating deposition process, wherein the stress gradient is increased during plating of the stressed-metal layer over the self-releasing layer.

11. The method of claim 9 wherein:
the stressed-metal layer comprises a low-stress layer and a high-stress layer wherein the high-stress layer is provided over the low-stress layer.

12. The method of claim 9, further comprising:
clamping the stressed-metal layer to the self-releasing layer with the clamping structure after the release of the stressed-metal layer from the self-releasing layer.

13. The method of claim 12, further comprising:
releasing the stressed-metal layer from the self-releasing layer by removal of the clamping structure.

14. The method of claim 13, wherein:
the release of the stressed-metal layer from the self-releasing layer after a delay is triggered by one of at least heat, laser, vibrations, a defect, one or more chemical reactions and biological substances binding to the stressed-metal layer.

* * * * *